United States Patent
Huang et al.

(10) Patent No.: US 10,268,547 B2
(45) Date of Patent: Apr. 23, 2019

(54) MEMORY PROTECTION DEVICE AND METHOD

(71) Applicant: INDUSTRIAL TECHNOLOGY RESEARCH INSTITUTE, Hsinchu (TW)

(72) Inventors: Li-Ren Huang, Zhubei (TW);
Chih-Jen Yang, Taoyuan (TW);
Yung-Chang Chang, Taipei (TW);
Kung-Ming Ji, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 196 days.

(21) Appl. No.: 14/952,912

(22) Filed: Nov. 25, 2015

(65) Prior Publication Data
US 2017/0109236 A1   Apr. 20, 2017

(30) Foreign Application Priority Data
Oct. 15, 2015   (TW) .............................. 104133858 A (51) Int. Cl.
*G06F 11/00*   (2006.01)
*G06F 11/14*   (2006.01)
(Continued)

(52) U.S. Cl.
CPC ........ *G06F 11/1417* (2013.01); *G06F 11/073* (2013.01); *G06F 11/0787* (2013.01);
(Continued)

(58) Field of Classification Search
CPC .. G06F 11/1417; G06F 11/073; G06F 11/263; G06F 11/0787; G06F 12/14; G06F 15/167; G11C 29/10; G11C 29/52
(Continued)

(56) References Cited

U.S. PATENT DOCUMENTS 5,260,783 A * 11/1993 Dixit ................... H04N 21/236
348/700
6,961,890 B2   11/2005 Smith
(Continued)

FOREIGN PATENT DOCUMENTS

| CN | 101599305 A | 12/2009 |
|----|-------------|---------|
| TW | 583541 B    | 4/2004  |
| TW | I482014 B   | 4/2015  |

OTHER PUBLICATIONS

Michail Maniatakos et al., "Multiple-Bit Upset Protection in Microprocessor Memory Arrays Using Vulnerability-Based Parity Optimization and Interleaving", pp. 2447-2460, IEEE Transactions on Very Large Scale Integration (VLSI) Systems, Vol. 23, No. 11, Nov. 2015.
(Continued)

*Primary Examiner* — Albert Decady
*Assistant Examiner* — Osman M Alshack
(74) *Attorney, Agent, or Firm* — Rabin & Berdo, P.C.

(57) ABSTRACT

A memory protection device is used for protecting a memory. The memory protection device includes a filtering unit and an encoding unit. The filtering unit searches an input data and outputs an encoding selection signal based on a bit component pattern of the input data. The encoding unit selects one or more encoding implementations among a plurality of encoding implementations based on the encoding selection signal from the filtering unit, to encode the input data.

10 Claims, 9 Drawing Sheets

(51) Int. Cl.
*G06F 11/07* (2006.01)
*G11C 29/52* (2006.01)
*G06F 11/10* (2006.01)
*G06F 11/263* (2006.01)
*G11C 29/10* (2006.01)

(52) U.S. Cl.
CPC ........ *G06F 11/1012* (2013.01); *G11C 29/52* (2013.01); *G06F 11/263* (2013.01); *G11C 29/10* (2013.01)

(58) Field of Classification Search
USPC ................................. 714/718, 755, 758, 763
See application file for complete search history.

(56) References Cited

U.S. PATENT DOCUMENTS

| | | | | |
|---|---|---|---|---|
| 7,188,296 | B1* | 3/2007 | Cypher | H03M 13/134 |
| | | | | 714/755 |
| 7,801,308 | B1* | 9/2010 | Hang | H04L 9/0822 |
| | | | | 380/277 |
| 8,510,636 | B2 | 8/2013 | Ruby et al. | |
| 8,527,544 | B1* | 9/2013 | Colgrove | G06F 3/0608 |
| | | | | 707/791 |
| 8,589,762 | B2 | 11/2013 | Rivers et al. | |
| 8,799,559 | B2* | 8/2014 | Sharon | G06F 12/0246 |
| | | | | 711/103 |
| 8,806,294 | B2 | 8/2014 | Ramaraju | |
| 8,862,967 | B2 | 10/2014 | Pancholi et al. | |
| 8,910,018 | B2 | 12/2014 | Huang et al. | |
| 8,924,825 | B2 | 12/2014 | Matsuoka et al. | |
| 9,026,895 | B2 | 5/2015 | Ou | |
| 9,081,062 | B1 | 7/2015 | Pedersen | |
| 9,087,612 | B2 | 7/2015 | Franceschini et al. | |
| 2007/0064816 | A1* | 3/2007 | Chiang | H04N 19/139 |
| | | | | 375/240.29 |
| 2010/0311432 | A1* | 12/2010 | Lauer | H04L 1/0065 |
| | | | | 455/450 |
| 2012/0121013 | A1* | 5/2012 | Lainema | H04N 7/32 |
| | | | | 375/240.12 |
| 2012/0260150 | A1* | 10/2012 | Cideciyan | G06F 11/1008 |
| | | | | 714/773 |
| 2013/0067300 | A1 | 3/2013 | Matsuoka et al. | |
| 2013/0086353 | A1* | 4/2013 | Colgrove | G06F 3/0608 |
| | | | | 711/206 |
| 2013/0205181 | A1* | 8/2013 | Blaum | G06F 11/1076 |
| | | | | 714/763 |

OTHER PUBLICATIONS

V. Buttigieg et al., "Variable-length error-correcting codes", pp. 211-215, proceedings of IEE Proc.-Commun., vol. 147, No. 4, Aug. 2000.

Jangwon Park et al., "VL-ECC: Variable Data-Length Error Correction Code for Embedded Memory in DSP Applications", pp. 120-124, IEEE Transactions on Circuits and Systems—II: Express Briefs, vol. 61, No. 2, Feb. 2014.

Michail Maniatakos et al., "AVF-driven Parity Optimization for MBU Protection of In-core Memory Arrays", pp. 1480-1485, 978-3-9815370-0-0/DATE13/c 2013 EDAA, Mar. 2013.

Costas A. Argyrides et al., "Matrix-Based Codes for Adjacent Error Correction", pp. 2106-2111, IEEE Transactions on Nuclear Science, vol. 57, No. 4, Aug. 2010.

Pedro Reviriego et al., "Reducing the Cost of Single Error Correction With Parity Sharing", pp. 420-422, IEEE Transactions on Device and Materials Reliability, vol. 13, No. 3, Sep. 2013.

Giorgio Cellere et al., "Radiation Effects on Floating-Gate Memory Cells", pp. 2222-2228, IEEE Transactions on Nuclear Science, vol. 48, No. 6, Dec. 2001.

S. Gerardin et al., "Radiation Effects in Flash Memories", pp. 1953-1969, IEEE Transactions on Nuclear Science, vol. 60, No. 3, Jun. 2013.

Nauman Z. Butt et al., "Modeling Single Event Upsets in Floating Gate Memory Cells", pp. 547-555, 978-1-4244-2050-6/08 © 2008 IEEE, 2008.

Taiwanese Office Action dated Aug. 8, 2016.

* cited by examiner

MEMORY PROTECTION DEVICE AND METHOD

This application claims the benefit of Taiwan application Serial No. 104133858, filed Oct. 15, 2015, the disclosure of which is incorporated by reference herein in its entirety.

TECHNICAL FIELD

The disclosure relates in general to a memory protection device and method.

BACKGROUND

Non-volatile memory is common used in many systems. In aerospace industry and vehicle industry, there are many researches about how to protect data stored in the non-volatile memory. From scientific or technical literature reports, radiation from IC package material or cosmic rays from outer space negatively influences data stored in the non-volatile memory, or even makes systems unstable or failure.

Thus, it needs a memory protection device and method which may perform error correction and/or error detection to protect data stored in the memory.

SUMMARY

The disclosure is directed to a memory protection device and method which selects encoding implementations based on the input data.

According to one embodiment, a memory protection device is provided. The memory protection device is for protecting a memory. The memory protection device includes a filtering unit and an encoding unit. The filtering unit searches an input data and outputs an encoding selection signal based on a bit component pattern of the input data. The encoding unit, based on the encoding selection signal from the filtering unit, selects one or more encoding implementations among a plurality of encoding implementations to encode the input data.

According to another embodiment, a memory protection method for protecting a memory is provided. An input data is searched to output an encoding selection signal based on a bit component pattern of the input data. One or more encoding implementations among a plurality of encoding implementations are selected based on the encoding selection signal to encode the input data.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Common technologies or theories may be omitted if they do not involve technical features of the application. Each of the disclosed embodiments has one or more technical features. In possible implementation, one skilled person in the art would selectively implement part or all technical features of any embodiment of the disclosure or selectively combine part or all technical features of the embodiments of the disclosure.

Figure 1:
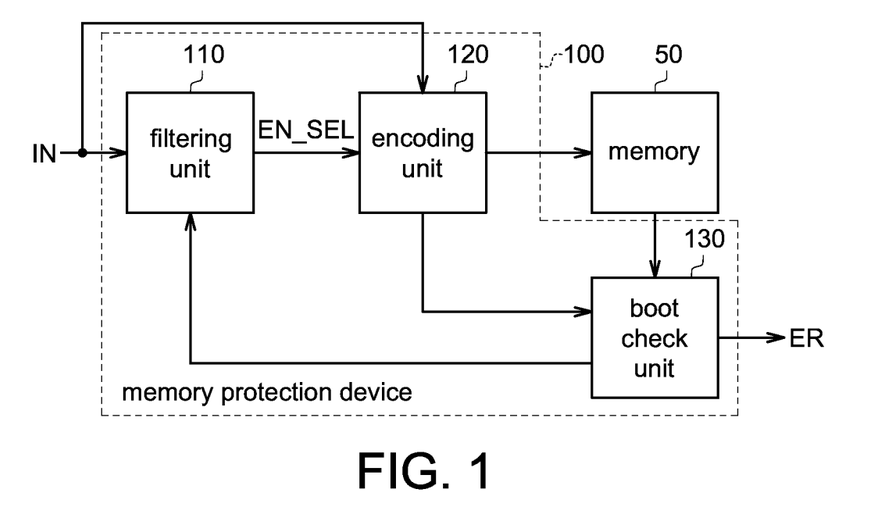
FIG. 1 shows a functional block diagram of a memory protection device according to an embodiment of the application.

FIG. 1 shows a functional block diagram of a memory protection device according to an embodiment of the application. As shown in FIG. 1, the memory protection device 100 according to the embodiment of the application may perform error detection and/or error correction to protect data stored in a memory 50. For example, the memory 50 may be implemented by a non-volatile memory but the application is not limited by.

The memory protection device 100 includes a filtering unit 110, an encoding unit 120 and a boot check unit 130.

The filtering unit 110 searches an input data IN and outputs an encoding selection signal EN_SEL based on a bit component pattern of the input data. The bit component pattern of the input data is defined as follows.

The encoding unit 120 selects one or more encoding implementations among a plurality of encoding implementations based on the encoding selection signal EN_SEL from the filtering unit 110, for encoding the input data IN. In encoding the input data IN, one or more different encoding implementations are selected.

During booting, the boot check unit 130 performs booting check before a processor (not shown) of an electronic device access the memory 50. If errors are found, the boot check unit 130 generates an error signal ER. If the check is passed, the boot check unit 130 notifies the processor and thus the processes may access the memory 50. The details of the booting check are as follows.

Encoding in the embodiment of the application is described. Now refer to FIG. 2A-FIG. 2F which show encoding implementation according to an embodiment of the application.

Figure 2A:
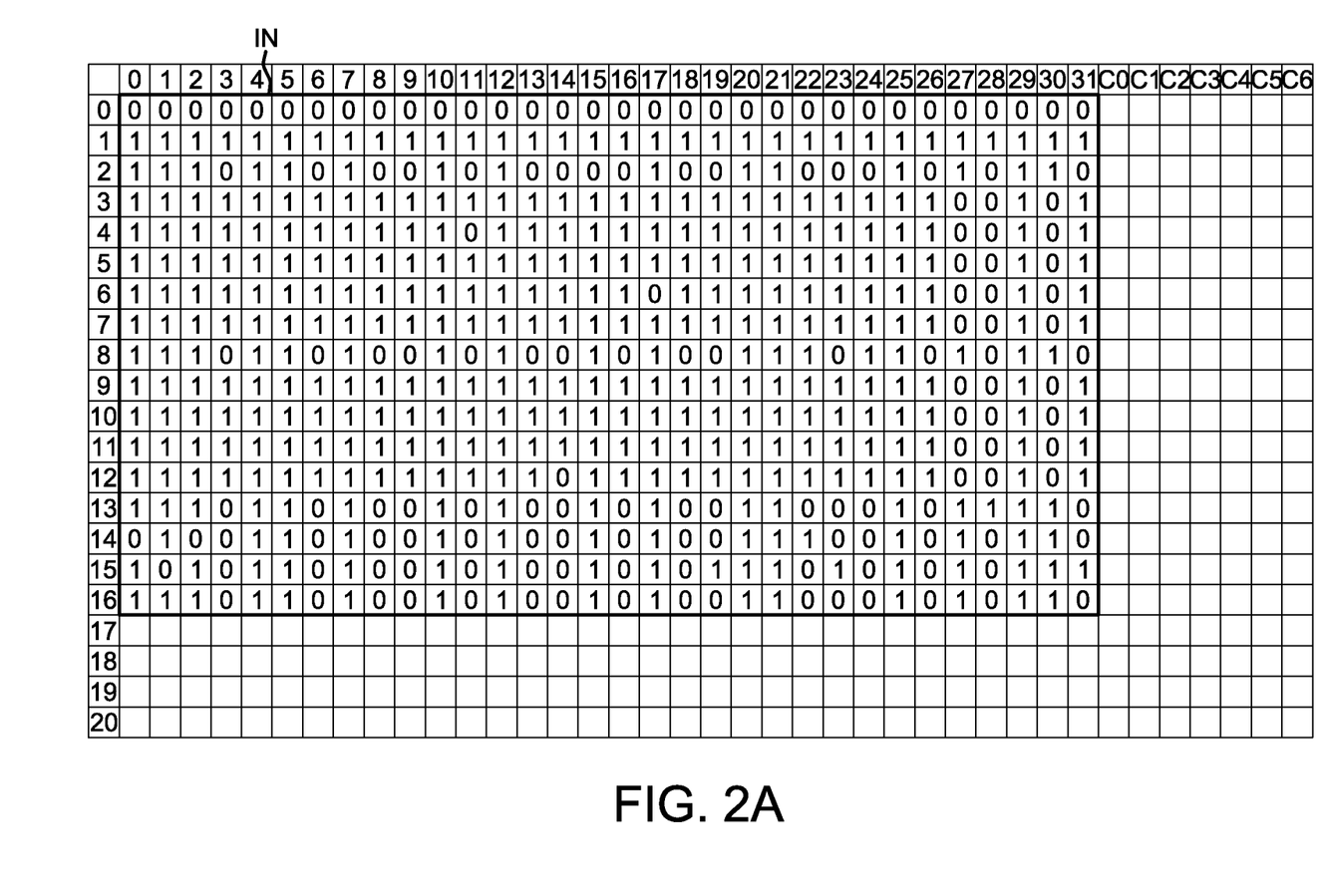
FIG. 2A-FIG. 2F show encoding implementation according to an embodiment of the application.

FIG. 2A shows an example of the input data IN. The input data IN includes 32*17 data, which is taken as an example. The application is not limited by.

Figure 2B:
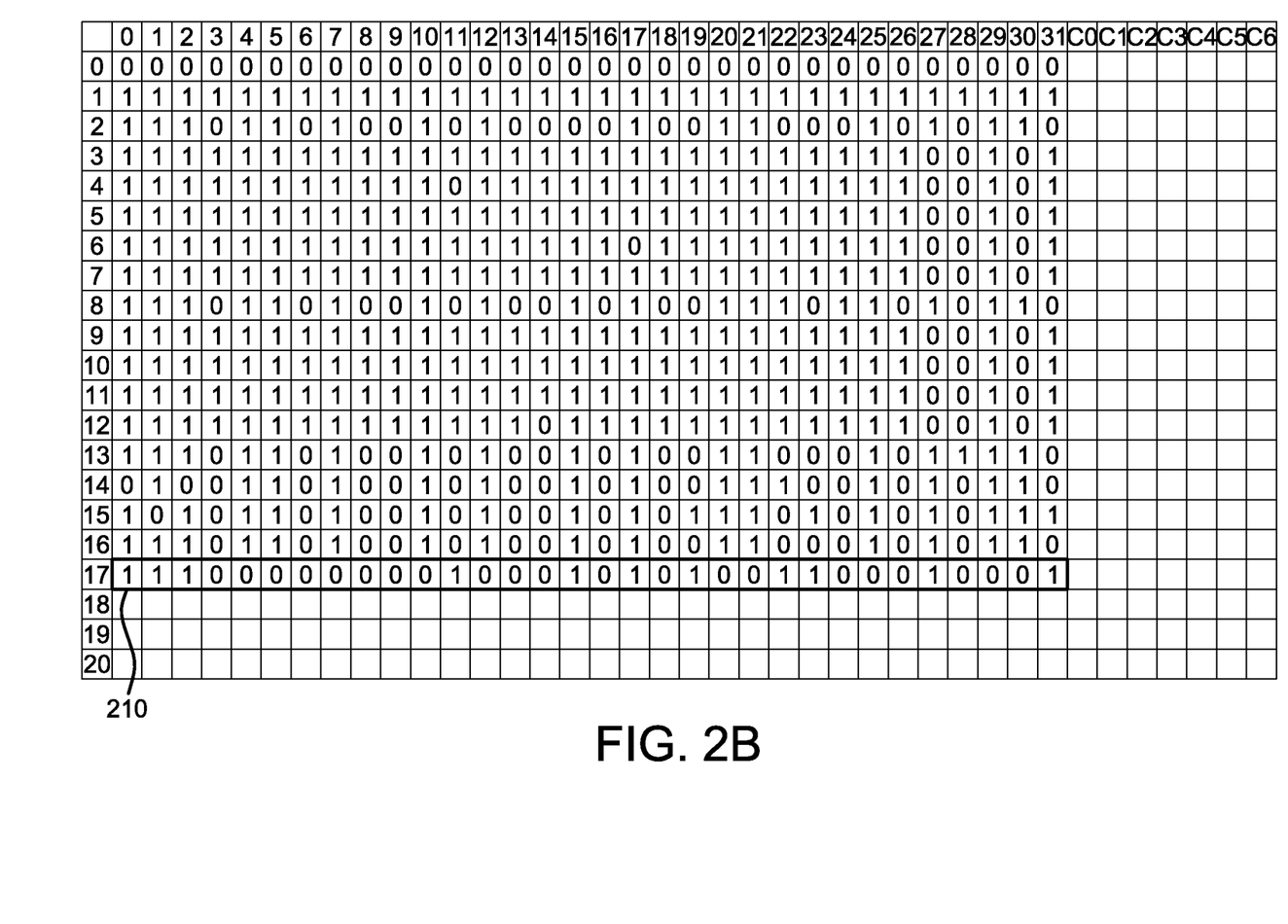

FIG. 2B shows that a first encoding is performed on the input data IN to obtain a first redundant bit group 210. The first encoding performed on the input data IN is for example but not limited by even parity check. In details, even parity check is performed on the respective columns 0-31 of the input data IN to obtain respective 1 parity bit of each column. The parity bits of the 32 columns form the first redundant bit group 210. The first redundant bit group 210 is written into the row 17 of the memory 50. Column 0 is taken as an example. Because the column 0 has 15 bits "1", the parity bit of the column 0 is "1" (which is written into address 0 of the row 17). Other details are similar.

Figure 2C:
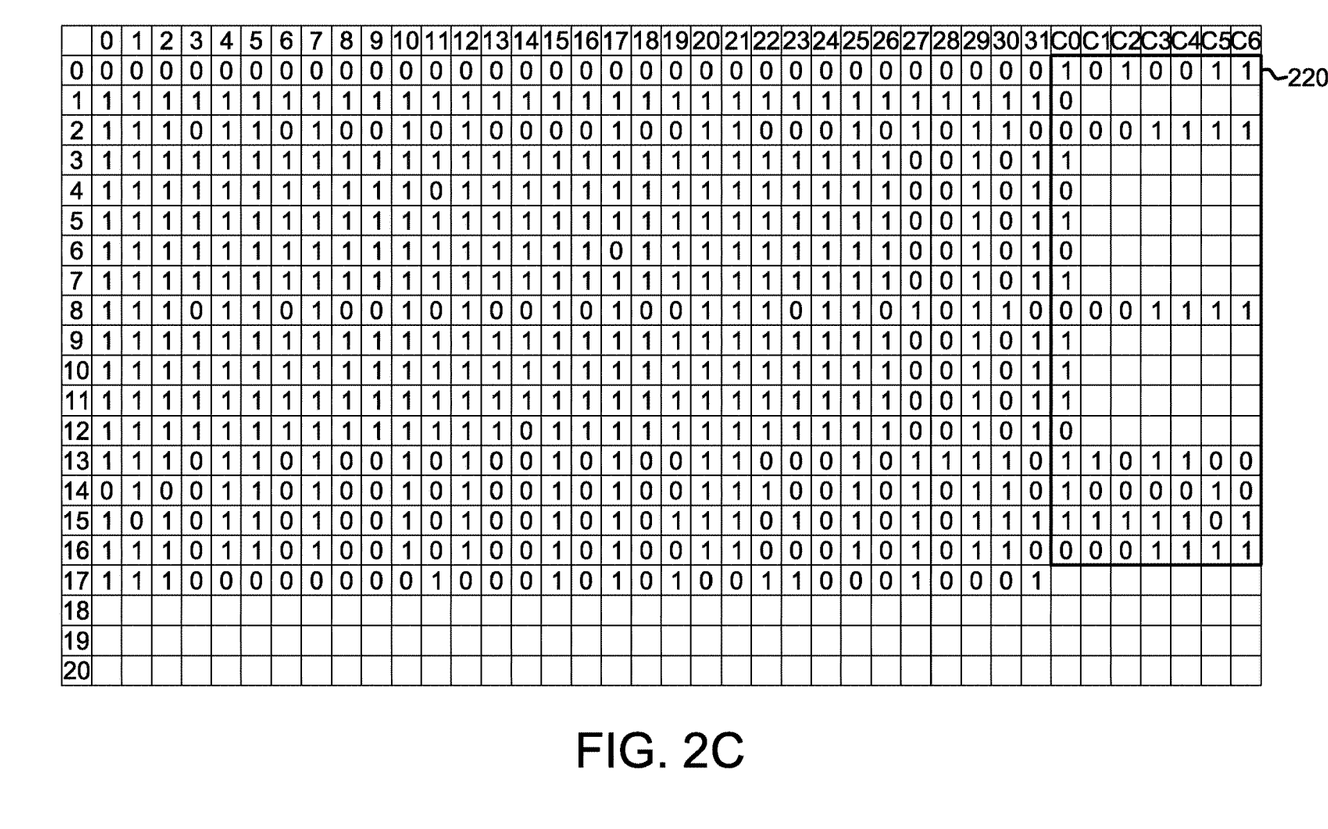
Figure 2D:
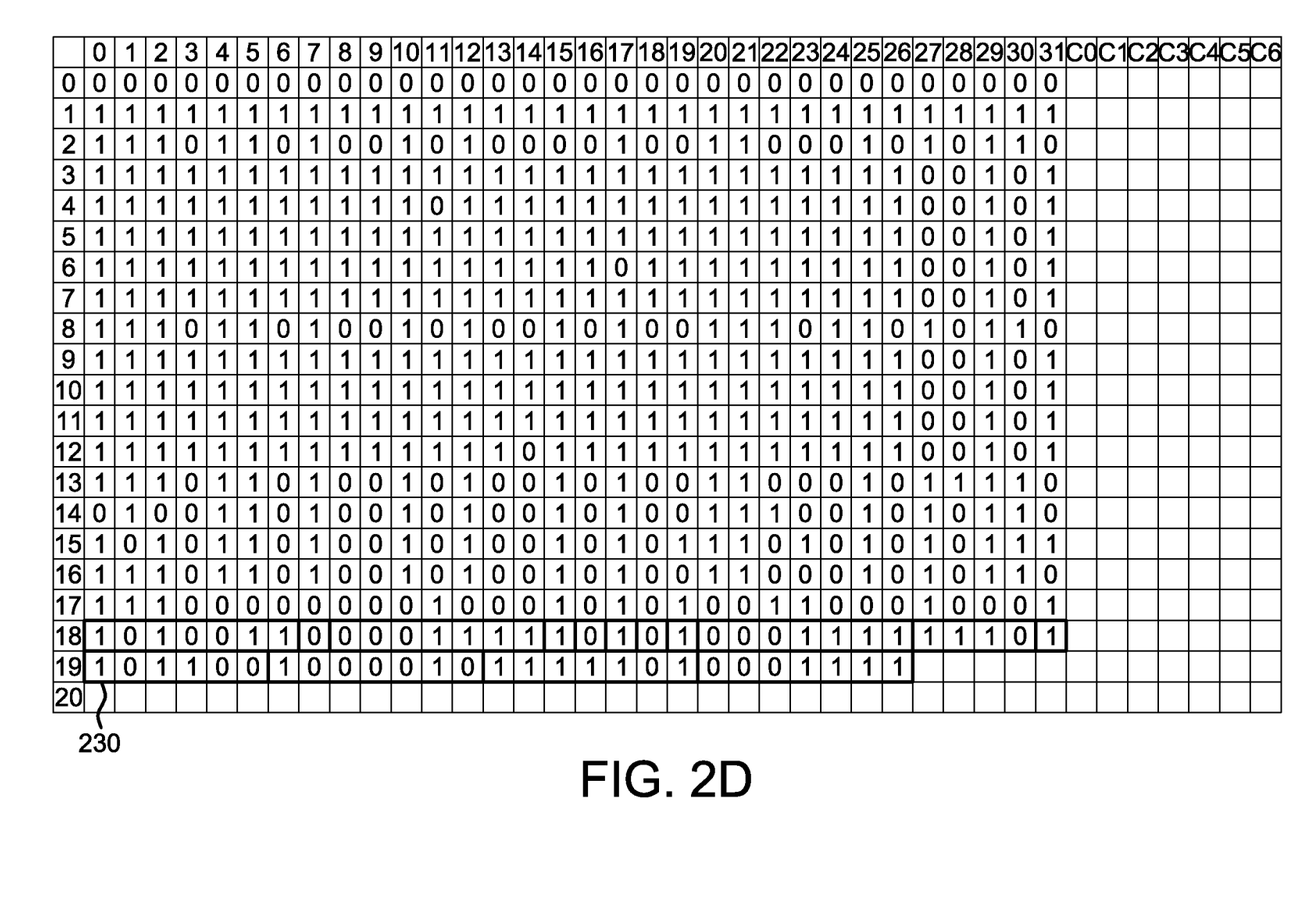

FIG. 2C shows that a second encoding is performed on the input data IN to obtain a second redundant bit group 220. The second encoding performed on the input data IN is for example but not limited by even parity check and/or ECC (error correction code). Each of rows 0-16 of the input data IN is searched to identify the bit component pattern of each row of the input data IN, to determine the respective encoding implementation on each row of the input data IN (which is performed by the filtering unit 110). Row 0 is taken as an example. Row 0 has 1 bit "1" and 31 bits "0". The filtering unit 110 determines that the ratio of bit "0" of the row 0 is higher than a threshold value (which is for example but not limited by 50%). The filtering unit 110 sends the encoding selection signal EN_SEL to the encoding unit 120 to notify the encoding unit 120 for performing 7 bit ECC encoding on the row 0 (the encoded codes are "1010011" which has higher bit cost). Row 1 is taken as an example. Row 1 has 32 bits "1" and 0 bit "0". The filtering unit 110 determines that the ratio of bit "0" of the row 0 is lower than the threshold value. The filtering unit 110 sends the encoding selection signal EN_SEL to the encoding unit 120 to notify the encoding unit 120 for performing even parity check on the row 1 (the encoded code is "0" which has lower bit cost). The second encoding performed on the input data IN results in the second redundant bit group 220. Columns C0-C6 are used for temporarily buffering the encoding codes. In other words, in the embodiment of the application, the respective encoding implementations on each row of the input data IN may be the same or different, which depends on the bit component pattern of each row of the input data IN.

In other possible embodiments of the application, other different encoding implementations may be used. For example, the threshold values may be set as 25% and 75%. If the ratio of bit "0" of the row is between 0-25%, the row is encoded by the even parity check. If the ratio of bit "0" of the row is between 25%-75%, the row is encoded by the checksum. If the ratio of bit "0" of the row is between 75%-100%, the row is encoded by ECC. Although in the above example, the ratio of bit "0" of the row is used to determine the encoding implementation performed on the row, but in other possible embodiments of the application, the ratio of bit "1" of the row may be used to determine the encoding implementation performed on the row. This is also within the spirit and the scope of the application.

That is to say, in an embodiment of the application, the bit component pattern (i.e. the ratio of bit "0" and/or bit "1") of the respective row of the input data is used to determine the encoding implementation performed on the row of the input data. The reason why the embodiment of the application uses a plurality of encoding implementations is that, research reveals that in the memory, the error rate of bit "0" and bit "1" is different and is not symmetric. In other words, the error that bit "0" is erroneous stored as bit "1" (for example due to external environment influence) is easily occurred but the error that bit "1" is erroneous stored as bit "0" is not easily occurred. Thus, in the embodiment of the application, before encoding, the input data is searched or scanned to determine whether data to be encoded is easily influenced by external environment (that is, to determine the extent which indicates how an external environment influences data). If the row of data has more bits "0", then the row is easily influenced by external environment. If the row of data has more bits "1", then the row is not easily influenced by external environment. If it is determined that data to be encoded is easily influenced by external environment (that is, the row of data includes higher ratio of bit "0"), then in encoding, more encoding codes are used to protect data to be encoded (for example, 7 bits ECC encoding which has higher bit cost) and thus protection cost is also higher. On the contrary, if it is determined that data to be encoded is not easily influenced by external environment (that is, the row of data includes lower ratio of bit "0"), then in encoding, fewer encoding codes are used to protect data to be encoded (for example, 1 bit even parity check which has fewer bit cost) and thus protection cost is also lower. The embodiment of the application trades off between encoding protection ability and protection cost.

In other possible embodiments of the application, the weight of respective rows of the data may be obtained based on each row data of the input data, and the encoding selection signal EN_SEL is generated by the weight (to determine the encoding implementations). For example, if a row has all bits "1", then the weight is set as 0. If a row has more than 16 bits "0" (i.e. if the ratio of bit "0" is over a half), the weight is set as being larger than or equal to 16. If a row has all bits "0", the weight is set as 32. In the above, determining the weight of bit "0" of the row data is taken as an example, but in other possible embodiments of the application, determining the weight of bit "1" of the row data is also within the spirit and scope of the application.

Based on the weight, the encoding implementations are determined. For example but not limited by, if the weight is smaller than 3, 1-bit parity check is used. If the weight is between 4-8, 2-bit parity check is used. If the weight is between 8-16, 4-bit ECC is used. If the weight is larger than or equal to 16, 5-bit ECC is used. That is, the bit component pattern includes weight of bit "0" and/or bit "1".

In the above description, the columns are encoded and then the rows are encoded, but the application is not limited by. In other possible embodiments of the application, the rows are encoded and then the columns are encoded, which is also within the spirit and scope of the application.

Figure 2E:
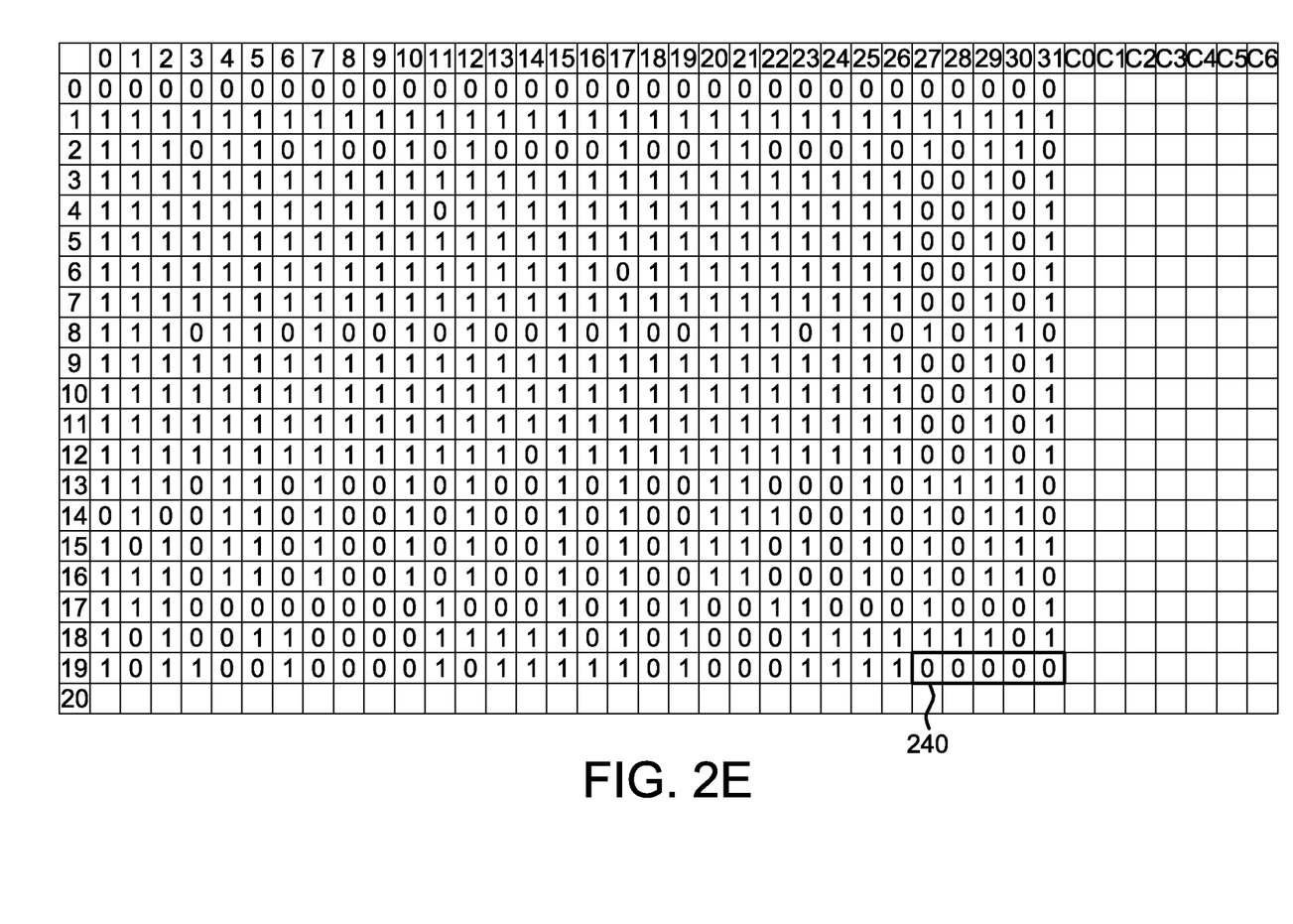

If row 19 is not fully filled up by the second redundant bit group 220/230, in the embodiment of the application, blank address of the row 19 may be filled up by bit(s) "0" and/or bit(s) "1" of the filling bit group 240 in FIG. 2E.

In other possible embodiments of the application, rows 17-19 are encoded and the encoding codes of the rows 17-19 are written into the memory 50.

Figure 2F:
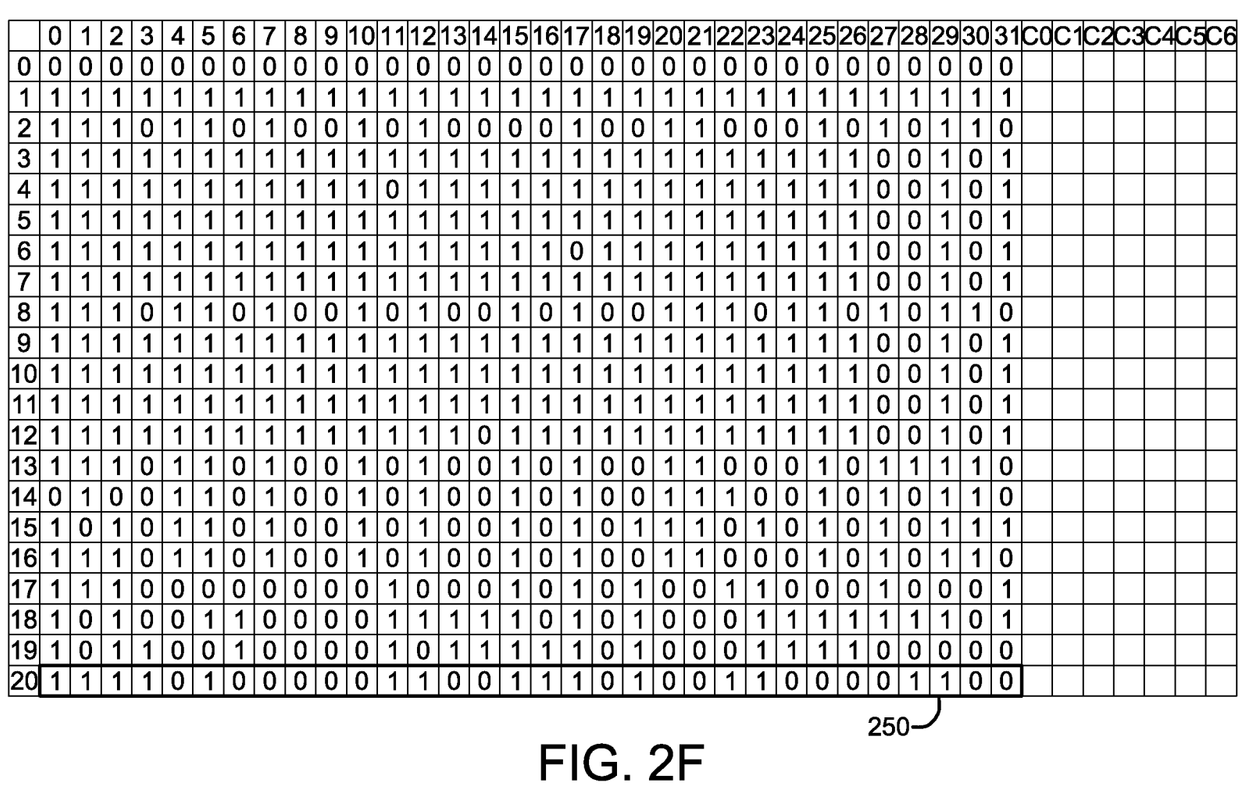

In FIG. 2F, the first redundant bit group 210, the second redundant bit group 220 and/or the filling bit group 240 are encoded (for example but not limited by, even parity check) to obtain a third redundant bit group 250, and the third redundant bit group 250 is written into row 20 of the memory. In details, the addresses 17-19 of column 0 are encoded by even parity check to obtain encoded codes (bit "1") and bit "1" is written into address 0 of row 20. Other details are similar. In other words, in the embodiment of the application, the rows and the columns of the input data are encoded for protection, respectively and the encoding codes are encoded again.

Figure 3A:
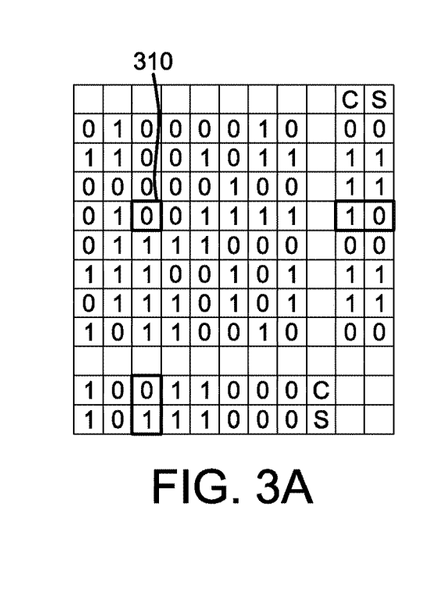
FIG. 3A-FIG. 3C show error detection and error correction according to an embodiment of the application.
Figure 3B:
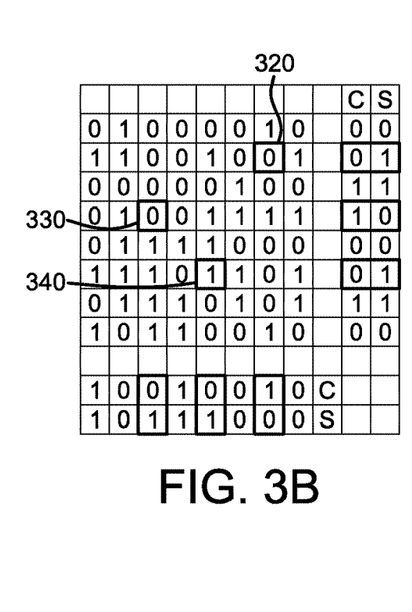
Figure 3C:
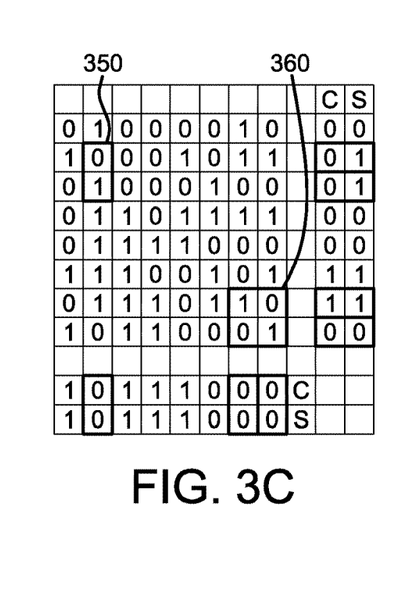

FIG. 3A-FIG. 3C show error detection and error correction according to an embodiment of the application. FIG. 3A shows single error detection and correction according to an embodiment of the application. FIG. 3B shows multiple error detection and correction according to an embodiment of the application. FIG. 3C shows multiple error detection and not correction according to an embodiment of the application.

In FIG. 3A, "C" refers to redundant bit obtained from encoding the readout data, and "S" refers to redundant bit stored in the memory. "C" and "S" are compared to determine whether parity check error occurs. If an error 310 exists in the input data, in the embodiment of the application, "C" and "S" of the fourth row and "C" and "S" of the third column are used to detect and correct the error 310.

Similarly, as shown in FIG. 3B, if errors 320-340 exist in the input data, in the embodiment of the application, "C" and "S" of the second, the fourth and the sixth rows and "C" and "S" of the third, the fifth and the seventh columns are used to detect and correct the errors 320-340. Even if the errors do not exist in the same row or in the same column, the embodiment of the application may detect and correct the errors.

Similarly, as shown in FIG. 3C, if error 350 exists in the input data, in the embodiment of the application, "C" and "S" of the second and the third rows and "C" and "S" of the second column are used to detect the error 350, but the error 350 cannot be corrected. The embodiment of the application detects the error 350 but cannot correct the error 350. If error 360 exists in the input data, in the embodiment of the application, "C" and "S" of the seventh and the eighth rows and "C" and "S" of the seventh and the eighth columns are used to detect the error 360, but the error 360 cannot be detected. The embodiment of the application cannot detect the error 360.

FIG. 3A-FIG. 3C may be also applied to the error detection and/or error correction on the first redundant bit group 210, the second redundant bit group 230, the filling bit group 240 and/or the third redundant bit group 250, and details are omitted.

Figure 4:
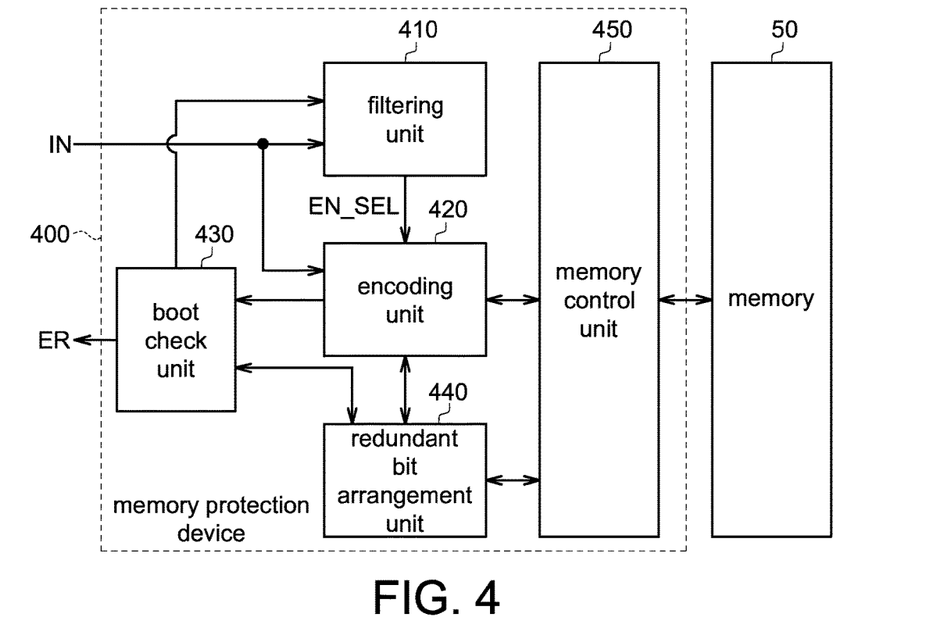
FIG. 4 shows a functional block diagram of a memory protection device according to another embodiment of the application.

FIG. 4 shows a functional block diagram of a memory protection device according to another embodiment of the application. As shown in FIG. 4, the memory protection device 400 includes a filtering unit 410, an encoding unit 420, a boot check unit 430, a redundant bit arrangement unit 440 and a memory control unit 450. The filtering unit 410, the encoding unit 420, and the boot check unit 430 may be the same or similar to the filtering unit 110, the encoding unit 130, and the boot check unit 130 of FIG. 1 and details thereof are omitted.

When the filtering unit 410 receives the input data IN, the filtering unit 410 searches and/or scans the bit component pattern of the input data IN to output the encoding selection signal EN_SEL to the encoding unit 420. Based on the encoding selection signal EN_SEL, the encoding unit 420 selects one or more encoding implementations from the encoding implementations to encode the input data IN.

The redundant bit arrangement unit 440 collects to arrange the first redundant bit group 210, the second redundant bit group 230, the filling bit group 240 and/or the third redundant bit group 250 into a data width compatible to the memory 50, and generates a plurality of addresses.

The memory control unit 450 writes the input data IN into the memory 50, and writes the first redundant bit group 210, the second redundant bit group 230, the filling bit group 240 and/or the third redundant bit group 250, which are arranged by the redundant bit arrangement unit 440, into the memory 50 based on the addresses.

During booting, the boot check unit 430 reads the input data IN and the encoding codes from the memory 50. The boot check unit 430 controls the filtering unit 410, the encoding unit 420 and the redundant bit arrangement unit 440 to perform operations thereof for feeding back the operation results to the boot check unit 430. The boot check unit 430 compares the input data IN and the encoding codes read from the memory 50 with the operation result from the filtering unit 410, the encoding unit 420 and the redundant bit arrangement unit 440, for checking whether the memory 50 has errors. If yes, the boot check unit 430 sends an error signal ER. If the check result shows correct, the boot check unit 430 allows the processor to access the memory 50.

In other possible embodiments of the application, the memory protection device may further include a plurality of data buffers for buffering the input data IN which is to written into the memory.

The booting check flow of an embodiment of the application is as follows. The boot check unit 430 reads the third redundant bit group 250 from the memory 50 to check whether the first redundant bit group 210 and the second redundant bit group 230 have errors. If yes, the boot check unit 430 corrects the errors. If the boot check unit 430 cannot correct the errors, then the boot check is failed, and the boot check unit 130/430 sends the error signal ER.

If the boot check unit 430 determines that the first redundant bit group 210 and the second redundant bit group 230 do not have errors, the boot check unit 430 reads the second redundant bit group 220/230 from the memory 50 to check whether the memory 50 has errors. If the memory 50 has errors, the boot check unit 430 corrects the errors. If the boot check unit 430 cannot correct the errors, then the boot check is failed, and the boot check unit 130/430 sends the error signal ER.

If the boot check unit 430 determines that the memory 50 does not have errors, the boot check unit 430 reads the first redundant bit group 210 from the memory 50 to check whether the memory 50 has errors. If the memory 50 has errors, the boot check unit 430 corrects the errors. If the boot check unit 430 cannot correct the errors, then the boot check is failed and the boot check unit 130/430 sends the error signal ER.

Of course, the sequence in reading out the second redundant bit group 220/230 and the first redundant bit group 210 is not limited by. If all checks show that no error exists, the test on the memory 50 is passed.

Figure 5:
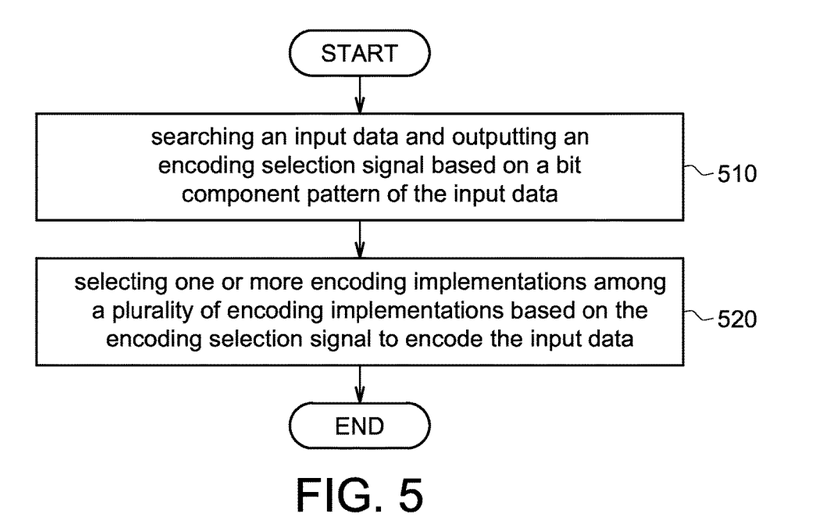
FIG. 5 shows a flow chart of a memory protection method according to another embodiment of the application.

FIG. 5 shows a flow chart of a memory protection method according to another embodiment of the application. As shown in FIG. 5, in step 510, an input data is searched, and an encoding selection signal is output based on a bit component pattern of the input data. Details of step 510 are described above and thus are omitted here.

In step 520, based on the encoding selection signal, one or more encoding implementations are selected among a plurality of encoding implementations to encode the input data. Details of step 520 are described above and thus are omitted here.

Other embodiment of the application provides a memory decoding implementation which is used to decode the encoding codes encoded by the embodiment of the application. Details thereof are omitted here.

From the above description, in the embodiment of the application, based on (1) the ratio of bit "0" and/or bit "1" of the input data, and/or (2) the weight of bit "0" and/or bit "1" of the input data, and/or (3) an extent which indicates how an external environment influences each row data of the input data, one or more corresponding encoding implementations may be chosen (i.e. to decide the bit number of the redundant bit) to balance off between the encoding protection and encoding cost. In other words, in an embodiment of the application, the bit component pattern includes a ratio of bit "0" and/or bit "1" of each row data of the input data, and/or a weight of bit "0" and/or bit "1" of each row data of the input data, and/or an extent which indicates how an external environment influences each row data.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory protection device for protecting a memory, the memory protection device including:
   a filtering unit, searching input data and outputting an encoding selection signal based on a bit component pattern of the input data;
   an encoding unit, based on the encoding selection signal from the filtering unit, selecting one or more encoding implementations among a plurality of encoding implementations to encode the input data; and
   a boot check unit, performing a boot check during a booting, to read from the memory, to control the filtering unit and the encoding unit in operation, and to compare readout data from the memory with an operation result from the filtering unit and the encoding unit, for checking whether the memory has errors, wherein
   the encoding unit performs a first encoding on each column of the input data to obtain a first redundant bit group, and writes the first redundant bit group into the memory,
   the encoding unit performs a second encoding on each row of the input data to obtain a second redundant bit group, and writes the second redundant bit group into the memory, wherein the second encoding is dependent on the respective bit component pattern of each row of the input data,
   if the second redundant bit group does not fully fill up a row of the memory, a filling bit group is filled in the row to fully fill up the row of the memory,
   the first redundant bit group, the second redundant bit group and/or the filling bit group are encoded to obtain a third redundant bit group, and the third redundant bit group is written into the memory,
   the filtering unit searches each row of data of the input data to output the encoding selection signal based on the bit component pattern of each row of data of the input data, and
   the bit component pattern of each row of data of the input data includes: a ratio of bit "0" and/or bit "1" of each row of data, and/or a weight of bit "0" and/or bit "1" of each row of data, and/or an extent which indicates how an external environment influences each row of data.

2. The memory protection device according to claim 1, wherein
   the encoding unit selects the respective encoding implementations among the encoding implementations based on the encoding selection signal from the filtering unit to encode each row of data of the input data, and the respective encoding implementations on each row of data of the input data are the same or different.

3. The memory protection device according to claim 1, wherein
   if the bit component pattern of a row of data of the input data is higher than a threshold value, the encoding unit selects a first encoding implementation to encode the row of data of the input data, and
   if the bit component pattern of a row of data of the input data is lower than the threshold value, the encoding unit selects a second encoding implementation, which has different encoding cost from the first encoding implementation, to encode the row of data of the input data.

4. The memory protection device according to claim 1, wherein during booting,
   the boot check unit reads the third redundant bit group from the memory to check whether the first redundant bit group and the second redundant bit group have errors, if yes, the boot check unit corrects the errors, and if the boot check unit cannot correct the errors, then the boot check is failed,
   if the boot check unit determines that the first redundant bit group and the second redundant bit group do not have errors, the boot check unit reads the second redundant bit group from the memory to check whether the memory has errors, if the memory has errors, the boot check unit corrects the errors, and if the boot check unit cannot correct the errors, then the boot check is failed, and
   if the boot check unit determines that the memory does not have errors, the boot check unit reads the first redundant bit group from the memory to check whether the memory has errors, if the memory has errors, the boot check unit corrects the errors, and if the boot check unit cannot correct the errors, then the boot check is failed.

5. The memory protection device according to claim 1, further including:
   a redundant bit arrangement unit, for collecting to arrange the first redundant bit group, the second redundant bit group, the filling bit group and/or the third redundant bit group into a data width compatible to the memory, and for generating a plurality of addresses, and
   a memory control unit, for writing the input data into the memory, and for writing the first redundant bit group, the second redundant bit group, the filling bit group and/or the third redundant bit group, which are arranged by the redundant bit arrangement unit, into the memory based on the addresses.

6. A memory protection method for protecting a memory, the memory protection method including:
   searching, by a filtering unit, input data and outputting an encoding selection signal based on a bit component pattern of the input data;
   selecting, by an encoding unit, one or more encoding implementations among a plurality of encoding implementations based on the encoding selection signal to encode the input data; and
   performing, by a boot check unit, a boot check during a booting, to read from the memory, to again perform the step of searching the input data and the step of selecting the one or more encoding implementations, and to compare readout data from the memory with an operation result obtained from again performing the step of searching the input data and the step of selecting the one or more encoding implementations, for checking whether the memory has errors, wherein
   a first encoding is performed, by the encoding unit, on each column of the input data to obtain a first redundant bit group, and the first redundant bit group is written into the memory,
   a second encoding is performed, by the encoding unit, on each row of the input data to obtain a second redundant bit group, and the second redundant bit group is written into the memory, wherein the second encoding is dependent on the respective bit component pattern of each row of the input data,
   if the second redundant bit group does not fully fill up a row of the memory, a filling bit group is filled in the row to fully fill up the row,
   the first redundant bit group, the second redundant bit group and/or the filling bit group are encoded to obtain a third redundant bit group, and the third redundant bit group is written into the memory, searching, by the filtering unit, each row of data of the input data to output the encoding selection signal based on the bit component pattern of each row of data of the input data, and the bit component pattern of each row of data of the input data includes: a ratio of bit "0" and/or bit "1" of each row of data, and/or a weight of bit "0" and/or bit "1" of each row of data, and/or an extent which indicates how an external environment influences each row of data.

7. The memory protection method according to claim 6, further including selecting the respective encoding implementations among the encoding implementations based on the encoding selection signal to encode each row of data of the input data, wherein the respective encoding implementations on each row of data of the input data are the same or different.

8. The memory protection method according to claim 6, further including if the bit component pattern of a row of data of the input data is higher than a threshold value, selecting a first encoding implementation to encode the row of data of the input data, and if the bit component pattern of a row of data of the input data is lower than the threshold value, selecting a second encoding implementation, which has different encoding cost from the first encoding implementation, to encode the row of data of the input data.

9. The memory protection method according to claim 6, further including, during the booting:

reading the third redundant bit group from the memory to check whether the first redundant bit group and the second redundant bit group have errors, if yes, correcting the errors, and if the errors cannot be corrected, then the boot check is failed, if determining that the first redundant bit group and the second redundant bit group do not have errors, reading the second redundant bit group from the memory to check whether the memory has errors, if the memory has errors, correcting the errors, and if the errors cannot be corrected, then the boot check is failed, and if determining that the memory does not have errors, reading the first redundant bit group from the memory to check whether the memory has errors, if the memory has errors, correcting the errors, and if the errors cannot be corrected, then the boot check is failed.

10. The memory protection method according to claim 6, further including:

collecting to arrange the first redundant bit group, the second redundant bit group, the filling bit group and/or the third redundant bit group into a data width compatible to the memory, and generating a plurality of addresses, and writing the input data into the memory, and writing the arranged first redundant bit group, the arranged second redundant bit group, the arranged filling bit group and/or the arranged third redundant bit group into the memory based on the addresses.

* * * * *